US009837923B2

(12) United States Patent
Raju et al.

(10) Patent No.: US 9,837,923 B2
(45) Date of Patent: Dec. 5, 2017

(54) INTEGRATED POWER CONVERTER AND TRANSFORMER

(71) Applicant: General Electric Company, Schenectady, NY (US)

(72) Inventors: Ravisekhar Nadimpalli Raju, Clifton Park, NY (US); Mark Edward Dame, Niskayuna, NY (US); Nathaniel Benedict Hawes, Ballston Spa, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 15/247,135

(22) Filed: Aug. 25, 2016

(65) Prior Publication Data
US 2017/0317604 A1    Nov. 2, 2017

Related U.S. Application Data

(60) Provisional application No. 62/328,198, filed on Apr. 27, 2016.

(51) Int. Cl.
*H02M 7/00* (2006.01)
*H05K 3/30* (2006.01)
(Continued)

(52) U.S. Cl.
CPC ............ *H02M 7/003* (2013.01); *H01F 27/10* (2013.01); *H01F 27/2847* (2013.01);
(Continued)

(58) Field of Classification Search
CPC ....... H02M 7/003; H05K 3/30; H05K 7/2089; H05K 1/0306; H05K 1/18; H05K 1/0204;
(Continued)

(56) References Cited

U.S. PATENT DOCUMENTS 4,563,383 A * 1/1986 Kuneman ............. H01L 23/142
257/E23.006
5,027,255 A * 6/1991 Zeitlin .................. H01L 25/162
257/E25.03

(Continued)

OTHER PUBLICATIONS

Haque S et al., "Thermal management of high-power electronics modules packaged with interconnected parallel plates", Semiconductor Thermal Measurement and Management Symposium, 1998. SEMI-THERM Proceedings 1998., Fourteenth Annual IEEE, pp. 111-119, Mar. 10-12, 1998, San Diego, CA.

(Continued)

*Primary Examiner* — Anthony Haughton
*Assistant Examiner* — Yahya Ahmad
(74) *Attorney, Agent, or Firm* — Nitin N. Joshi

(57) ABSTRACT

A power converter for a power system includes an input ceramic layer, an output ceramic layer, an input stage coupled to the input ceramic layer, an output stage coupled to the output ceramic layer, and a planar transformer coupled between said input stage and said output stage. The input receives a power input and the output stage generates a power output at least partially as a function of the power input. The planar transformer includes an input winding coupled to the input stage and an output winding coupled to the output stage. The input winding has a plurality of input turns and the output winding has a plurality of output turns. The input turns interleave the output turns.

20 Claims, 6 Drawing Sheets

(51) Int. Cl.
H05K 7/20 (2006.01)
H01F 38/14 (2006.01)
H05K 1/02 (2006.01)
H05K 1/03 (2006.01)
H05K 1/18 (2006.01)
H01F 27/10 (2006.01)
H01F 27/28 (2006.01)

(52) U.S. Cl.
CPC ........... H01F 38/14 (2013.01); H05K 1/0204 (2013.01); H05K 1/0306 (2013.01); H05K 1/18 (2013.01); H05K 3/30 (2013.01); H05K 7/2089 (2013.01); *H05K 2201/1003* (2013.01); *H05K 2201/10053* (2013.01); *H05K 2201/10174* (2013.01)

(58) Field of Classification Search
CPC ........... H05K 2201/10053; H05K 2201/1003; H05K 2201/10174; H01F 38/14; H01F 27/2847; H01F 27/10
USPC ........................................................ 361/717
See application file for complete search history.

(56) References Cited

U.S. PATENT DOCUMENTS

| 5,384,691 | A | 1/1995 | Neugebauer et al. | |
|---|---|---|---|---|
| 6,954,368 | B1* | 10/2005 | Francoeur | H02M 7/003 361/763 |
| 7,289,329 | B2* | 10/2007 | Chen | H01F 27/2804 165/185 |
| 7,450,388 | B2 | 11/2008 | Beihoff et al. | |
| 8,804,339 | B2 | 8/2014 | Robert | |
| 8,829,839 | B1* | 9/2014 | Vrankovic | H02K 11/0094 318/471 |
| 2011/0043317 | A1* | 2/2011 | Ikriannikov | H01F 17/06 336/192 |
| 2011/0187484 | A1* | 8/2011 | Owen | H01F 30/12 336/5 |
| 2014/0347154 | A1* | 11/2014 | Schmelzer | H01F 27/2804 336/170 |
| 2015/0303164 | A1 | 10/2015 | Chen | |
| 2016/0012967 | A1* | 1/2016 | Kurs | H02J 50/12 307/104 |

OTHER PUBLICATIONS

Ivanova M et al., "Heat Pipe Integrated in Direct Bonded Copper (DBC) Technology for Cooling of Power Electronics Packaging", JPower Electronics, IEEE Transactions on, vol. 21, Issue: 6, pp. 1541-1547, Nov. 2006.

European Search Report and Opinion issued in connection with corresponding EP Application No. 7168483.0 dated Sep. 28, 2017.

* cited by examiner

INTEGRATED POWER CONVERTER AND TRANSFORMER

CROSS REFERENCE TO RELATED APPLICATIONS

This application claims the benefit of priority of U.S. Provisional Patent Application Ser. No. 62/328,198, filed Apr. 27, 2016, which is hereby incorporated by reference in its entirety.

STATEMENT REGARDING FEDERALLY SPONSORED RESEARCH & DEVELOPMENT

This invention was made with government support under Grant No. N00014-15-C-0049 awarded by the Office of Naval Research. The government has certain rights in the invention.

BACKGROUND

The field relates generally to electrical power converters, and more specifically, to power converters with integrated planar transformers.

Electrical power converters are used in current power systems to perform a variety of applications. Some are used to convert power between alternating current (AC) power and direct current (DC) power while others convert power between two DC grids. More generally, power converters are defined as devices which change the magnitude, frequency, and/or phase of a voltage or current associated with the power. AC-to-DC power converters may be used in, for example, power supplies for cellphones, laptops, X-ray machines, and telecommunications equipment. DC-to-DC power converters may be used in hybrid electric vehicles, aircraft, and high-voltage DC (HVDC) systems. DC-to-DC power converters further may be used in photovoltaic systems for maximum power point tracking.

At least some known high density DC-to-DC converters, i.e., converters designed to operate with high-frequency power and/or high-magnitude power, used in telecom and server power supplies are built using power components, controls, and transformer windings coupled to an FR4 printed circuit board (PCB). The FR4 PCBs are formed from a composite material of woven fiberglass with an epoxy resin binder with conductive wires or traces added during manufacturing. However, FR4 PCBs have limited voltage isolation and thermal dissipation. Since high density DC-to-DC converters need sufficient voltage isolation and produce relatively large amounts of heat, at least some DC-to-DC converters are manufactured with separate subsystems that are wired together. Such converters with reduced integration result in reduced performance and/or increased cost of the converters due to the separate subsystems.

BRIEF DESCRIPTION

In one aspect, a power converter for a power system is provided. The converter includes an input ceramic layer, an output ceramic layer, an input stage coupled to the input ceramic layer, an output stage coupled to the output ceramic layer, and a planar transformer coupled between said input stage and said output stage. The input receives a power input and the output stage generates a power output at least partially as a function of the power input. The planar transformer includes an input winding coupled to the input stage and an output winding coupled to the output stage. The input winding has a plurality of input turns and the output winding has a plurality of output turns. The input turns interleave the output turns.

In another aspect, a power system is provided. The power system includes a power input device that generates a power input, a power output device that receives a power output, and a power converter. The power converter includes an input ceramic layer, an output ceramic layer, an input stage coupled to the input ceramic layer and the power input device, an output stage coupled to the output ceramic layer and the power output device, and a planar transformer coupled between the input stage and the output stage. The input stage receives the power input from the power input device and the output stage generates the power output at least partially as a function of the power input and transmits the power output to said power output device. The planar transformer includes an input winding coupled to the input stage, and an output winding coupled to the output stage. The input winding has a plurality of input turns and the output winding has a plurality of output turns. The input turns interleave the output turns.

In yet another aspect, a method for assembly a power converter for a power system is provided. The method includes coupling an input stage to an input ceramic layer, coupling an output stage to an output ceramic layer, and coupling a planar transformer between the input stage and the output stage. The input stage receives a power input and the output stage generates a power output at least partially as a function of the power input. The planar transformer includes an input winding coupled to the input stage and an output winding coupled to the output stage. The input winding has a plurality of input turns and the output winding has a plurality of output turns. The input turns interleave the output turns.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that may permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and interchanged; such ranges are identified and include all the sub-ranges contained therein unless context or language indicates otherwise.

The systems and methods described herein facilitate integrated power converters and transformers with improved voltage isolation and heat dissipation to enable high density power applications. The systems and methods described herein include a power converter with an integrated planar transformer. The power converter includes input and output stages that are copper directly bonded to ceramic layers for heat dissipation and voltage isolation. The input stage includes at least one input device, such as a switch, for receiving a power input from an external system. The output stage includes one or more output devices, such as diodes or switches, for generating a power output at least partially as a function of the power input to an external system. The integrated transformer is positioned between the input stage and the output stage and includes an input winding and an output winding. In the exemplary embodiment, the input and output windings are folded to form a plurality of input and output turns, respectively. The input turns and output turns are interleaved with each other and a plurality of insulating layers that include a ceramic material to dissipate heat and isolate the input and output turns.

Figure 1:
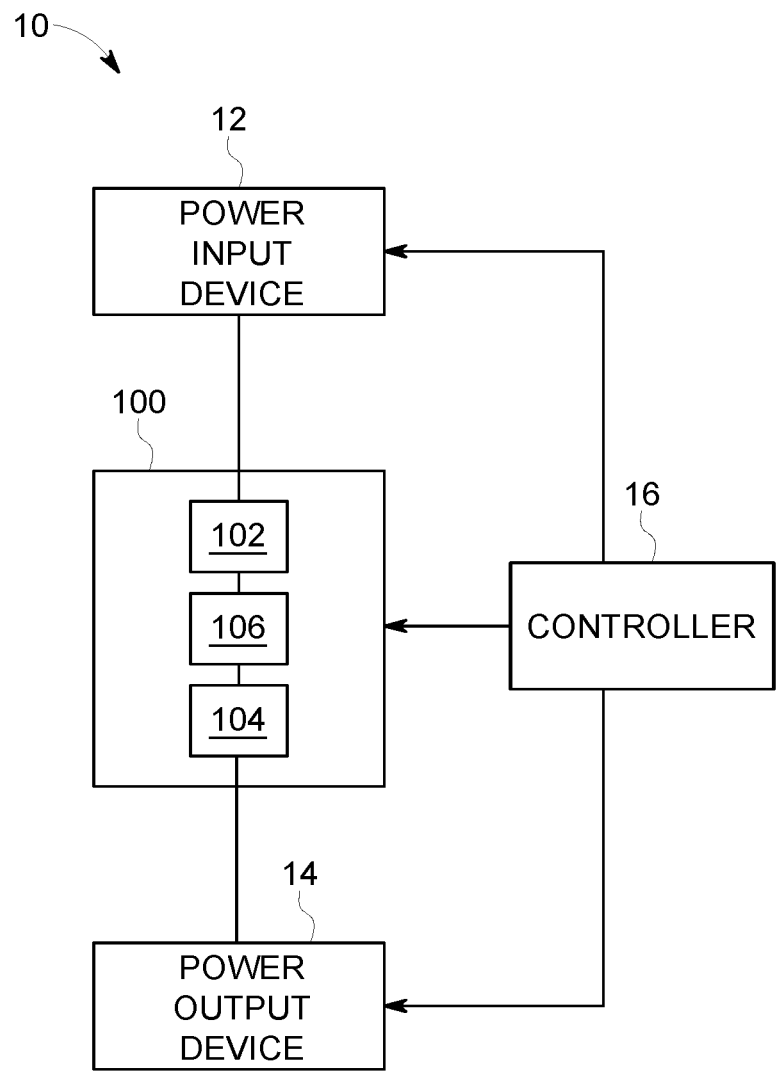
FIG. 1 is a schematic view of an exemplary power system including an exemplary power converter.

FIG. 1 is a schematic view of an exemplary power system 10. System 10 includes a power input device 12, a power output device 14, a controller 16 and a power converter 100 coupled between power input device 12 and power output device 14. In the exemplary embodiment, system 10 is configured to operate at high frequencies and/or power. For example, system 10 may be included in a wind turbine, telecommunications systems, power supplies, medical devices, and other systems that have high-frequency and/or power demands.

Power input device 12 is configured to generate, manipulate, or otherwise transfer a power input, $P_{in}$, supplied at a voltage, $V_{in}$, with a current defined to be, $i_{in}$, to converter 100. The power input $P_{in}$ is direct current (DC) power or alternating current (AC) power. Power input device 12 includes but is not limited to, a wire, a trace, a power supply, a switch, a diode, a capacitor, a resistor, an inductor, and/or other electrical components. Power input device 12 is part of power input stage of system 10 for generating and providing the power input $P_{in}$ to converter 100.

Converter 100 is configured to receive the power input $P_{in}$ and generate a power output $P_{out}$ at least partially as a function of the power input $P_{in}$. That is, converter 100 is configured to transform or otherwise manipulate the power input $P_{in}$ to generate the power output $P_{out}$. Converter 100 includes, but is not limited to, an AC-to-DC converter, a DC-to-DC converter, an AC-to-AC converter, and the like. In one example, converter 100 is an AC-to-DC converter configured to receive an AC power input and generate a DC power output as a function of the AC power input. In the exemplary embodiment, converter 100 includes an input stage 102, an output stage 104, and a transformer 106. Alternatively, converter 100 may include transformer 106 with only input stage 102 or output stage 104.

Input stage 102 is configured to receive the power input $P_{in}$ from power input device 12. Input stage 102 includes one or more switches, diodes, capacitors, inductors, and/or other electrical components or circuits (not shown in FIG. 1) that are configured to convert the power input $P_{in}$ to an intermediate power signal. In one example, input stage 102 includes an H-bridge configured to receive a DC power input and converter the power input into an AC intermediate power signal. Input stage 102 is coupled to a circuit board (not shown in FIG. 1), such as a direct bond copper (DBC) circuit board with an electrically insulating ceramic layer (also referred to as the "input ceramic layer"). The input ceramic layer provides voltage isolation between copper traces while also providing improved heat dissipation comparative to at least some known epoxy-based circuit boards. Although the circuit boards are referred to herein as DBC circuit boards, other circuit boards that include an electrically insulating layer that is configured to dissipate heat may be used. Similarly, different materials other than ceramic may be used that provide heat dissipation and voltage isolation for the circuit boards.

Transformer 106 is configured to receive the intermediate power signal from input stage 102 and transform the intermediate power signal. For example, transformer 106 is configurable to boost or reduce (i.e., a buck transformer) the intermediate power signal before transmitting the power signal to output stage 104. In some embodiments, transformer 106 is direct bond copper on one or more ceramic layers. In other embodiments, a different method such as the method described herein may be used to bond transformer 106 to the circuit board.

Output stage 104 is configured to receive the transformed power signal from transformer 106 and generate the power output $P_{out}$ in response. Output stage 104 includes one or more switches, diodes, capacitors, inductors, and/or other electrical components or circuits (not shown in FIG. 1) that are configured to generate the power output $P_{out}$. In one example, output stage 104 includes a plurality of rectifying diodes to generate a DC power output or a plurality of switches to generate an AC power output at a predetermined frequency. Similar to input stage 102, output stage 104 is coupled to a circuit board. In the exemplary embodiment, output stage 104 is direct bond copper on the circuit board. The circuit board may be coupled to the circuit board of input stage 102 (e.g., through transformer 106), or the circuit boards may be separate. Output stage 104 is further configured to transmit the power output $P_{out}$ to power output device 14. In some embodiments, converter 100 includes a plurality of output stages 104 coupled to transformer 106. Using multiple output stages enables converter 100 to provide multiple power outputs $P_{out}$ for each power input $P_{in}$. In one example, each output stage 104 is coupled to transformer 106 at different turns such that each output stage 104 receives a different power signal from transformer 106. In another example, transformer 106 includes a plurality of secondary windings such that each secondary winding is coupled to a separate output stage.

In the exemplary embodiment, system 10 further includes a controller 16 that is communicatively coupled to power input device 12, power output device 14, and/or converter 100. Controller 16 is configured to monitor and/or control system 10. In one embodiment, controller 16 is configured to provide control inputs to switches in system 10 to adjust the timing of the switches. In at least some embodiments, power input device 12, power output device 14, and/or converter 100 are passive devices (i.e., the components are not configured to be manipulated by control inputs). Controller 16 is configured to monitor system 10 to collect feedback and adjust any control inputs to cause system 10 to function based on predetermined parameters, such as frequency, power magnitude, phase, power factor, and so forth.

Figure 2:
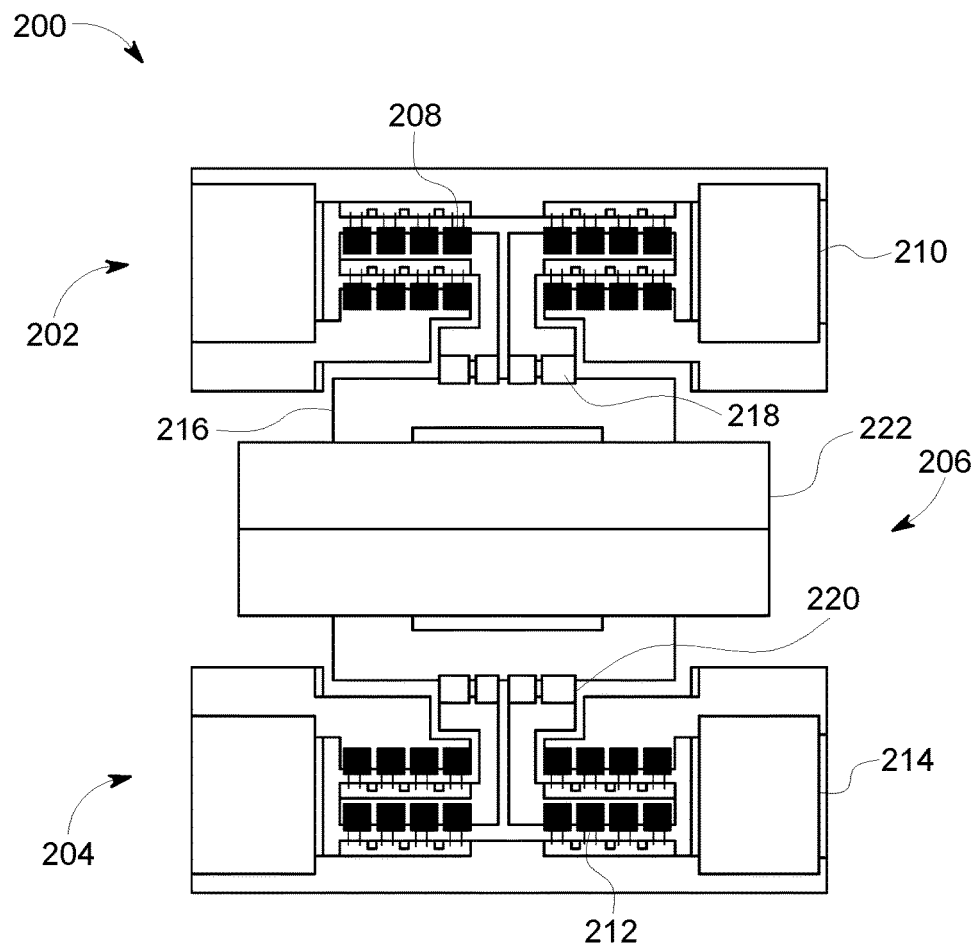
FIG. 2 is a schematic view of the power converter shown in FIG. 1.

FIG. 2 is a top plan view of an exemplary power converter 200 for use in system 10 (shown in FIG. 1). Converter 200 is similar to converter 100 (shown in FIG. 1) and, in the absence of contrary representation, includes similar components. In the exemplary embodiment, converter 200 includes an input stage 202, an output stage 204, and a transformer 206. In other embodiments, converter 200 may include additional, fewer, or alternative components, including those described elsewhere herein.

Input stage 202 includes a plurality of input devices 208 and a pair of DC input capacitors 210. In the exemplary embodiment, input stage 202 is direct bond copper on a ceramic-based circuit board (not shown in FIG. 2). Input devices 208 include, but are not limited to, diodes, silicon (Si) switches, silicon carbide switches (SiC), graphene switches, gallium nitride and/or other types of input devices. In some embodiments, input stage 202 includes circuits such as filters to facilitate improved performance. The ceramic-based circuit board facilitates heat dissipation of input devices 208 and enables the use of switches with increased operating frequency or power. Moreover, the ceramic-based circuit board provides voltage isolation between the electrically conductive copper traces of input stage 202. Output stage 204, similar to input stage 202, includes a plurality of output devices 212 and a pair of DC output capacitors 214. Output devices 212 include, for example, switches, diodes, passive components (e.g., capacitors, resistors, and inductors), snubbers, clamps, filters, and/or other components to facilitate generating a power output. Output stage 204 is direct bond copper to a ceramic-based circuit board (not shown in FIG. 2).

Transformer 206 is an integrated (i.e., on a circuit board), planar transformer. In the exemplary embodiment, only one winding 216 is shown. In such an embodiment, transformer 206 operates as an inductor to store and release magnetic energy from converter 200. Transformer 206 also includes an input connector 218, an output connector 220, and a core 222. Connectors 218, 220 are configured to electrically couple transformer 206 to input stage 202 and output stage 204, respectively. In some embodiments, connectors 218 and/or 220 include one or more series capacitors (not shown in FIG. 2) to prevent DC power from transferring to winding 216 and saturating core 222. Core 222 is a ferrite metal core (or other magnetically permeable material) positioned around a portion of winding 216. Core 222 includes an internal leg (not shown in FIG. 2) to separate each side of winding 216.

Figure 3:
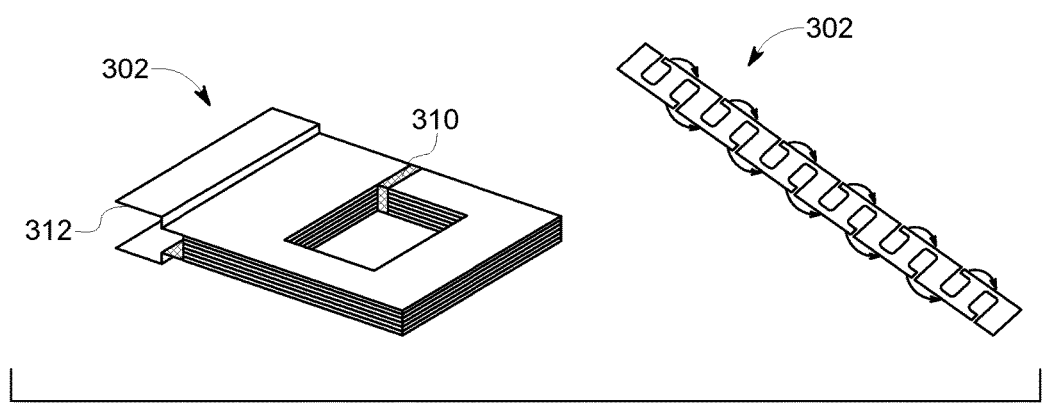
FIG. 3 is a perspective view of an input winding for the power converter shown in FIG. 1.
Figure 4:
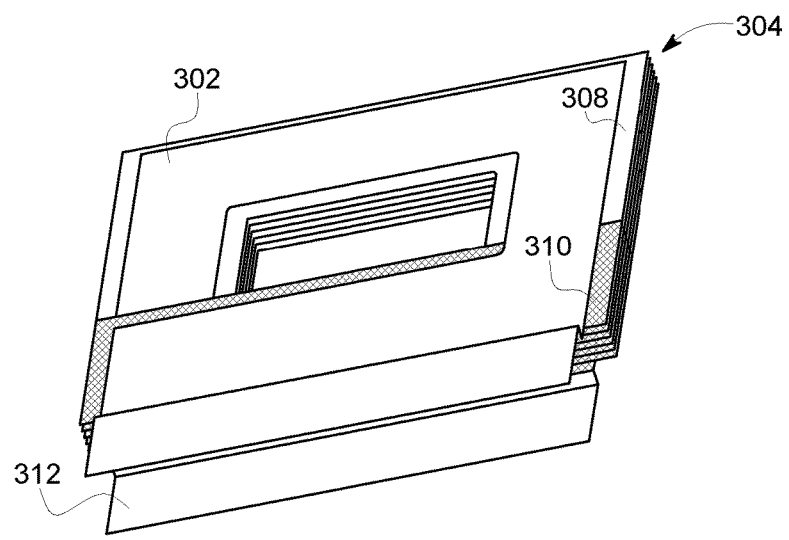
FIG. 4 is a perspective view of the input winding and insulating layers for the power converter shown in FIG. 1.
Figure 5:
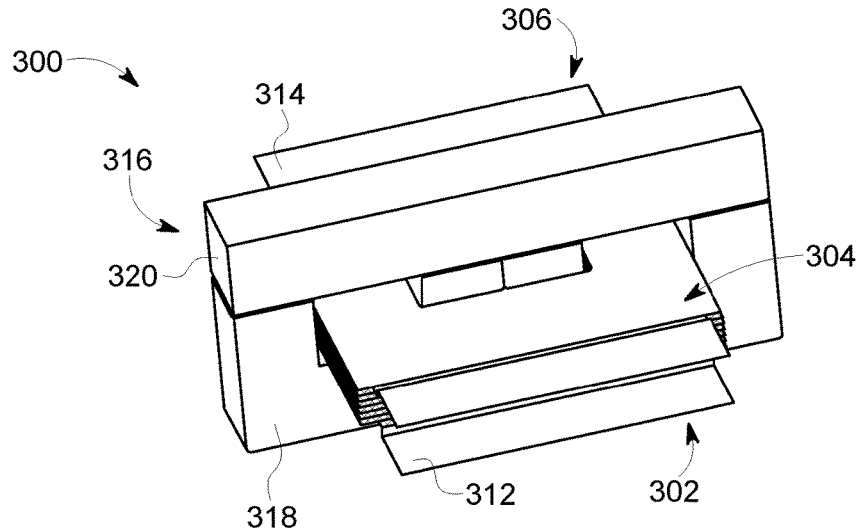
FIG. 5 is a perspective view of an exemplary planar transformer for the power converter shown in FIG. 1.
Figure 6:
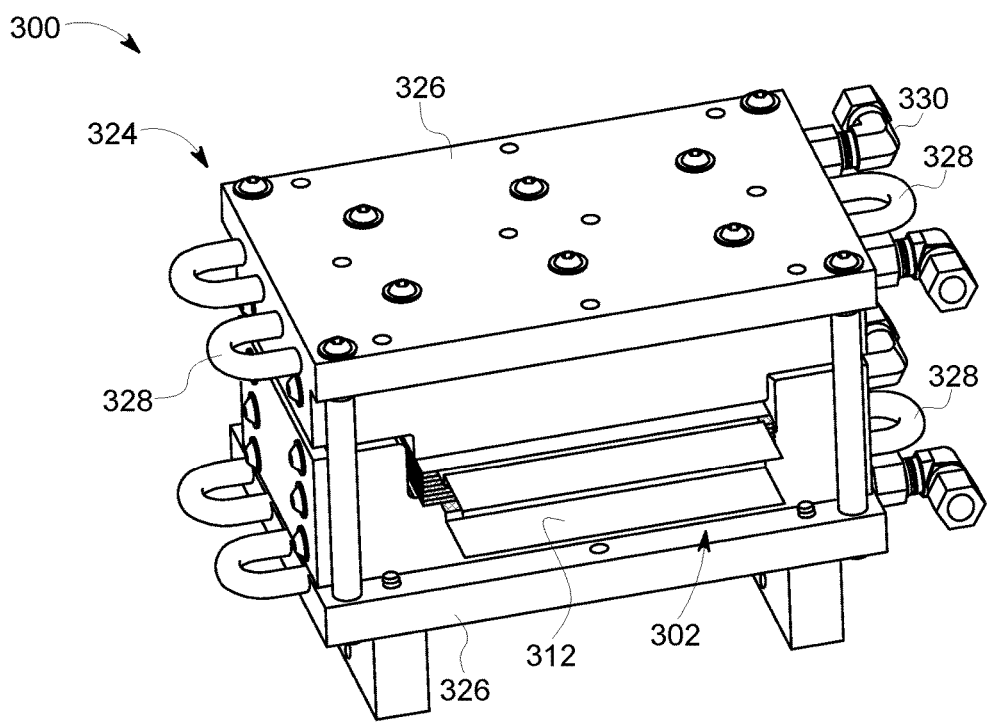
FIG. 6 is a perspective view of the exemplary planar transformer with a cooling system for the power converter shown in FIG. 1.

FIGS. 3-6 depict an exemplary transformer 300 for use in converter 100 in system 10 (both shown in FIG. 1). More specifically, FIG. 3 is a perspective view of an input winding 302, FIG. 4 is a perspective view of input winding 302 with a plurality of insulating layers 304, FIG. 5 is a perspective view of transformer 300 with input winding 302 and an output winding 306, and FIG. 6 is a perspective view of transformer 300 with liquid cooling. FIGS. 3 and 4 do not include output winding 306 for clarity purposes. Transformer 300 is similar to transformer 106 and 206 (shown in FIGS. 1 and 2, respectively), and in the absence of contrary representation, includes similar components and functionality.

In the exemplary embodiment, transformer 300 includes a single input winding 302 and a single output winding 306. Alternatively, in other embodiments, transformer 300 includes a plurality of input windings 302 and output windings 306. Input winding 302 and output winding 306 are substantially in vertical alignment with each other. In the exemplary embodiment, input winding 302 and output winding 306 are configured to be formed into a plurality of turns. With respect to FIG. 3, input winding 302 is shown on the right in an initial, flat configuration. To form input winding 302 shown on the left, winding 302 is folded over itself to form a stacked configuration. Each stacked layer represents an input turn. By using a single winding rather than multiple windings, the manufacturing cost of transformer 300 may be reduced. Although winding 302 is depicted as folding in an accordion style, winding 302 may be folded using a different method.

Each input turn is spaced apart from other input turns to facilitate insulating layers 304 as shown in FIG. 4. In the exemplary embodiment, insulating layers 304 include a ceramic material 308 and a binding material 310. Ceramic material 308 is configured to isolate input winding 302 from output winding 306 in addition to dissipate heat from transformer 300. Binding material 310 is configured to insulate transformer 300 in addition to secure input winding 302 and output winding 306 to insulating layers 306. In the exemplary embodiment, binding material is polyimide film (e.g., Kapton®, a product of DuPont). Alternatively, other insulating layers may be used. In one example, windings 302 and 304 are direct bond copper layers of ceramic material.

Output winding 306 is configured to fold similar to input winding 302 to form output turns. In the exemplary embodiment, the input turns and the output turns are substantially vertically aligned and interleave each other. That is, at least one insulating layer 304 is coupled between an input turn and an output turn. In some embodiments, not all insulating layers are coupled between an input turn and an output turn in some embodiments. For example, if the number of input turns is greater or less than the number of output turns, then a portion of insulating layers 304 is only coupled to an input turn or an output turn.

With respect to FIGS. 5 and 6, input winding 302 includes an input end 312 that is configured to electrically couple to input stage 102 (shown in FIG. 1) to input winding 302. Input end 312 receives the intermediate power signal from input stage 102. Transformer 300 transforms or converts the power signal through the magnetically coupled input and output windings 302, 306. Output winding 306 includes an output end 314 that is configured to electrically couple output stage 104 (shown in FIG. 1) to output winding 306. The transformed power signal is transferred to output stage 104 from output end 314.

Transformer 300 further includes a magnetic core 316 to facilitate magnetic coupling between input winding 302 and output winding 306. In the exemplary embodiment, core 316 includes two U-shaped pieces 318 and bar piece 320 that extends across both U-shaped pieces 318. U-shaped pieces 318 extend through an internal gap of windings 302, 306 and layers 304 to form a middle leg 322 of core 316. Alternatively, core 316 is formed in a different configuration. For example, in one embodiment, core 316 is a pot core.

With respect to FIG. 6, in the exemplary embodiment, cooling is be added to transformer 300 to facilitate increased heat dissipation and keep transformer 300 within prescribed operating temperatures. In the exemplary embodiment, transformer 300 includes a cooling system 324 for liquid cooling. That is, a thermally conductive fluid is used to collect heat from transformer 300 and transfer the heat away from transformer 300. Additionally, or alternatively, other active or passive cooling systems such as air-cooling systems may be used. In one example, cooling system 324 includes fans and/or heat sinks to provide air-cooling to transformer 300.

Cooling system 324 includes a cooling block 326, pipes 328, and joints 330 for each of the top and bottom of transformer 300. Cooling block 326 is formed from a thermally conductive material (e.g., a metal) to draw heat from transformer 300. Cooling block 326 have a relatively large surface area that contacts transformer 300 to provide improved heat transfer. Pipes 328 extend through block 326 in a winding configuration to facilitate increased surface area coverage of pipes 328. Pipes 328, similar to block 326, are made from a thermally conductive material such as copper. Pipers 328 are configured to transfer the fluid through block 326 to dissipate heat. Joints 330 are configured to attach to external cooling system (not shown) to receive and transmit the fluid.

Figure 7:
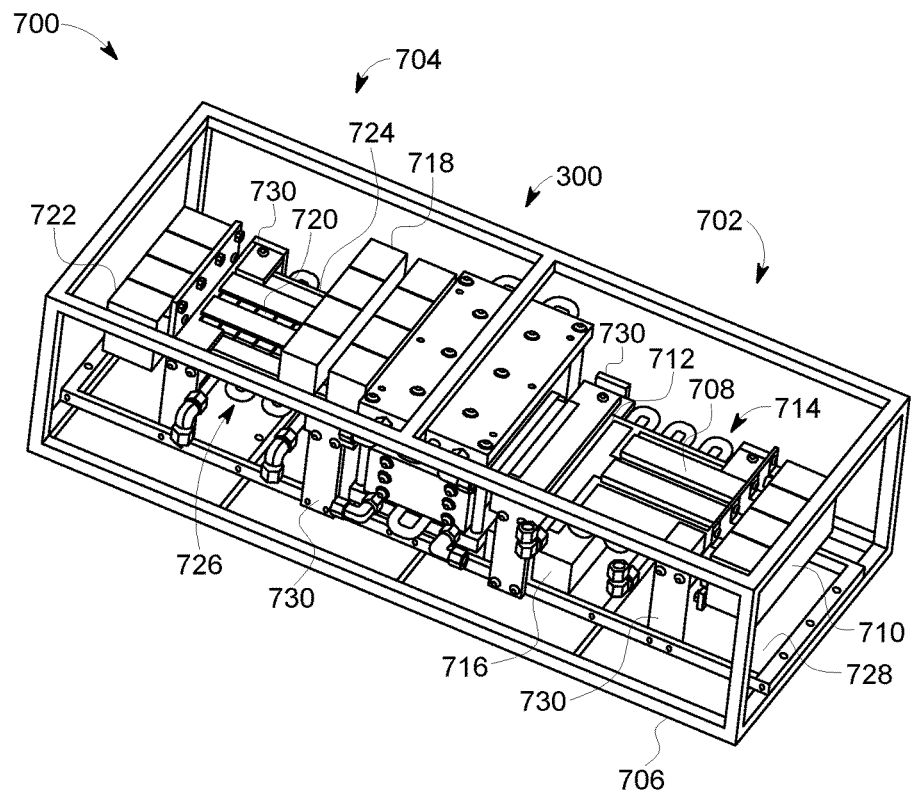
FIG. 7 is a perspective view of an exemplary direct current (DC) to DC power converter for the power system shown in FIG. 1.
Figure 8:
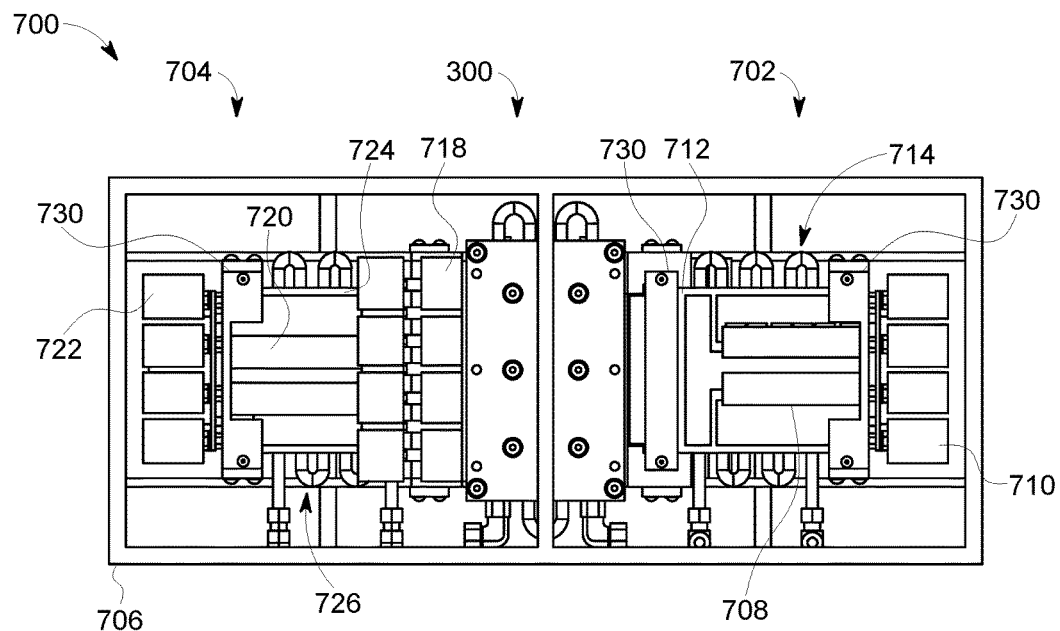
FIG. 8 is a top plan schematic view of the exemplary DC-to-DC power converter shown in FIG. 7.
Figure 9:
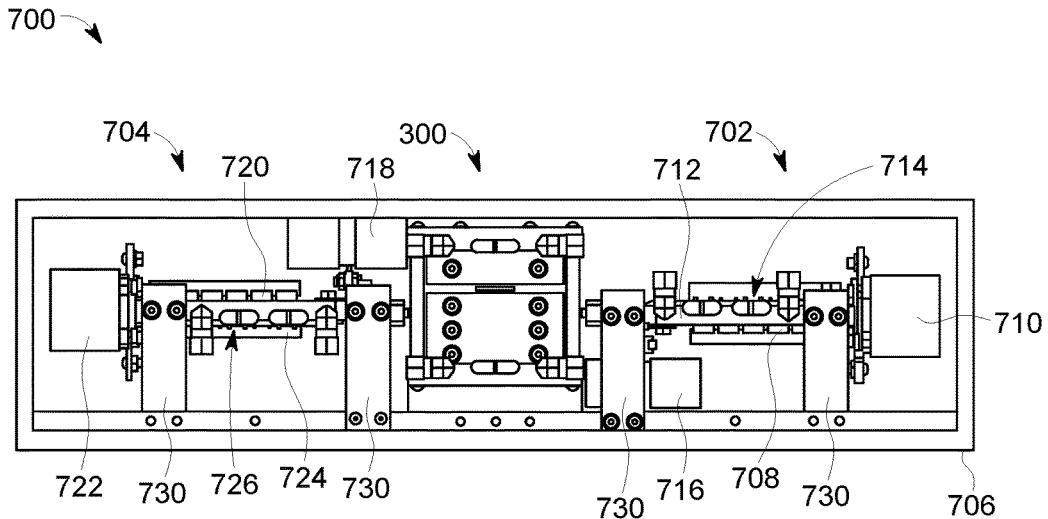
FIG. 9 is a side schematic view of the exemplary DC-to-DC power converter shown in FIG. 7.

FIGS. 7-9 depict an exemplary DC-to-DC power converter 700 for use in system 10 (shown in FIG. 1). More specifically, FIG. 7 is a perspective view of converter 700, FIG. 8 is a top plan schematic view of converter 700, and FIG. 9 is a side schematic view of converter 700. Converter 700 is similar to converters 100 and 200 (shown in FIGS. 1 and 2, respectively), and in the absence of contrary representation, includes similar components. In the exemplary embodiment, converter 700 includes transformer 300, an input stage 702, an output stage 704, and a frame 706.

Input stage 702 includes a plurality of switches 708 and a set of DC input capacitors 710. Input capacitors 710 are positioned at a right angle relative to switches 708. Input stage 702 is coupled to an input ceramic layer 712 using direct bond copper. Input stage 702 further includes a cooling system 714 that is configured to absorb heat from input stage 702 and/or input ceramic layer 712. In the exemplary embodiment, cooling system 714 is positioned on input ceramic layer 712 opposite switches 708 and is configured to provide liquid cooling. Additionally or alternatively, cooling system 714 is positioned at a different location relative to switches 708. In one example, cooling system 714 is integrated into input ceramic layer 712.

Switches 708 are configured to operate as an inverter. For example, switches 708 are configured receive a DC power input and generate an AC intermediate power signal as a function of the power input. The intermediate power signal is transferred to one or more input series capacitors 716, which are coupled between input stage 702 and transformer 300. Series capacitors 716 are configured to filter DC power from the intermediate power signal before reaching transformer 300. Otherwise, the DC power may saturate core 316 (shown in FIG. 5) and reduce the efficiency of converter 700.

Transformer 300 is configured to receive the AC intermediate power signal and transform the power signal based on the turns ratio of input winding 302 and output winding 306. Transformer may reduce or boost the voltage or current signal based on the turns ratio. The transformed intermediate voltage or current signal is then transferred to output stage 104 through one or more output series capacitors 718.

Output stage 104 includes a plurality of rectifying diodes 720 and a plurality of output DC capacitors 722. In the exemplary embodiment, output stage 104 has a similar configuration as input stage 102. Diodes 720 are configured to receive an AC intermediate power signal and generate a DC power output at least partially as a function of the power input (through the intermediate power signal). Diodes 720 are coupled to an output ceramic layer 724 using direct bond copper. In some embodiments, input and output ceramic layers 712, 724 are coupled to each other. In other embodiments, input ceramic layer 712 is separate from output ceramic layer 724. Output stage 104 further includes a cooling system 726 that is coupled to output ceramic layer 724 to provide liquid cooling. In other embodiments, cooling system 726 provides a different cooling method, such as air cooling or a combination of air and liquid cooling.

Frame 706 is configured to surround input stage 702, output stage 704, and transformer 300. Frame 706 includes a base 728, sides, and/or a top (not shown) to provide structural support to converter 700. In at least some embodiments, frame 706 may include a cooling system (not shown), such as heat sinks, vents, fans, and other cooling components. Frame 706 is configured to facilitate electrical connection between input and output stages 702, 704 and external devices (e.g., power input and output devices 12 and 14, respectively). Frame 706 further includes one or more supports 730 configured to secure input stage 702, output stage 704, and transformer 300. In some embodiments, supports 730 are configured to facilitate electrical connections and/or dissipate heat. In the exemplary embodiment, supports 730 raise input stage 702, output stage 704, and transformer 300 away from base 728 to provide air flow within frame 706.

Figure 10:
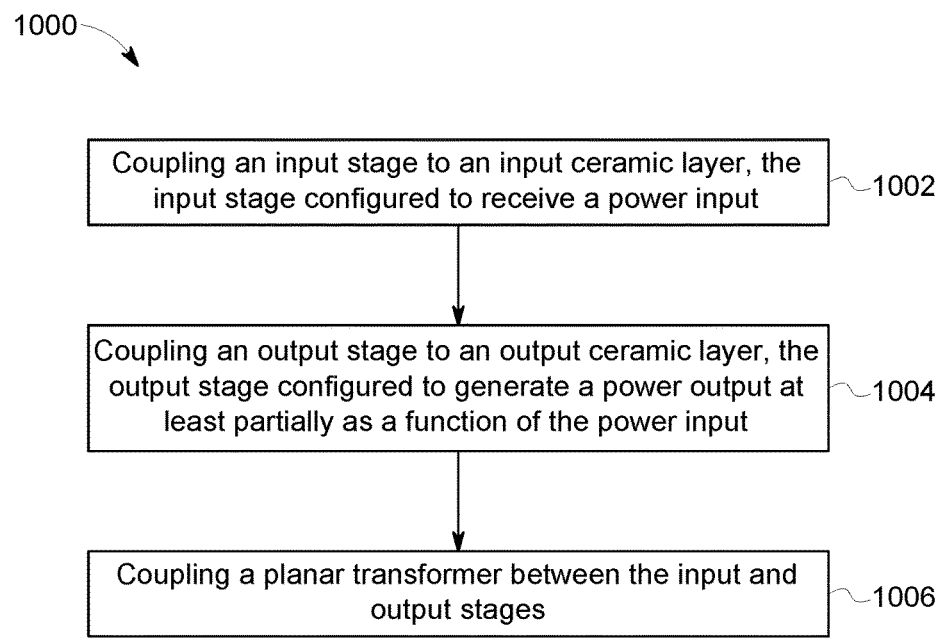
FIG. 10 is a flow diagram of an exemplary method for assembling the power converter shown in FIG. 1.

FIG. 10 is a flow diagram of an exemplary method 1000 for assembling power converter 100 for system 10 (shown in FIG. 1). Method 1000 may include additional, fewer, or alternative steps, including those described elsewhere herein.

With respect to FIGS. 1 and 10, method 1000 includes coupling 1002 input stage 102 to an input ceramic layer and coupling 1004 output stage 104 to an output ceramic layer (both ceramic layers not shown in FIGS. 1 and 10). Input stage 102 is configured to receive a power input $P_{in}$ from an external power system (e.g., input power device 12). Output stage 104 is configured to generate a power output $P_{out}$ at least partially as a function of the power input $P_{in}$. In some embodiments, input stage 102 and output stage 104 are coupled to the input and output ceramic layers, respectively, using direct bond copper.

Method 1000 further includes coupling 1006 planar transformer 106 between input stage 102 and output stage 104. Transformer 106 includes an input winding coupled to input stage 102 and an output winding coupled to output stage 104 (both windings not shown in FIGS. 1 and 10). The input and output windings each have a plurality of turns ("input turns" and "output turns"). In some embodiments, the input winding and the output winding are long, flat strips that are folded to form vertically aligned stacks of input and output turns. The input turns are interleaved and vertically aligned with the output turns. In at least some embodiments, a plurality of insulating layers (not shown in FIGS. 1 and 10) are positioned between each input turn and adjacent output turn. The insulating layers include a ceramic material for heat dissipation and voltage isolation. In one embodiment, the windings are bound to the insulating layers with a binding material. In another embodiment, the windings are direct bond copper on the ceramic-based insulating layers.

The above-described systems and methods facilitate integrated power converters and transformers with improved voltage isolation and heat dissipation. Specifically, the systems and methods facilitate integrated power converters and planar transformers with improved voltage isolation and heat dissipation for high density power applications. The above-described systems and methods include a power converter with an integrated planar transformer. The power converter includes input and output stages that use direct bond copper to couple to ceramic layers for heat dissipation and voltage isolation. The input stage includes at least one input device, such as a switch, for receiving a power input from an external system. The output stage includes one or more output devices, such as diodes or switches, for generating a power output at least partially as a function of the power input to an external system. The integrated transformer is positioned between the input stage and the output stage and includes an input winding and an output winding. In the exemplary embodiment, the input and output windings are folded to form a plurality of input and output turns, respectively. The input turns and output turns are interleaved with each other and a plurality of insulating layers that include a ceramic material to dissipate heat and isolate the input and output turns.

An exemplary technical effect of the methods, systems, and apparatus described herein includes at least one of: (a) improved voltage isolation and heat dissipation for power converters; (b) increased integration of power converters for high density power applications; and (c) reduced manufacturing costs for power converters and transformers.

Exemplary embodiments of integrated power converters and transformer and methods for assembling the same are described above in detail. The method and systems described herein are not limited to the specific embodiments described herein, but rather, components of systems or steps of the methods may be utilized independently and separately from other components or steps described herein. For example, the methods may also be used in combination with multiple integrated power converters, and are not limited to practice with only power converters as described herein. Additionally, the methods may also be used with other components of devices, and are not limited to practice with only the components as described herein. Rather, the exemplary embodiments may be implemented and utilized in connection with many other devices that have components that need to be replaced over time.

Although specific features of various embodiments may be shown in some drawings and not in others, this is for convenience only. In accordance with the principles of the systems and methods described herein, any feature of a drawing may be referenced or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A power converter comprising:
   an input ceramic layer;
   an output ceramic layer;
   an input stage coupled to said input ceramic layer, said input stage configured to receive a power input;
   an output stage coupled to said output ceramic layer, said output stage configured to generate a power output at least partially as a function of the power input; and
   a planar transformer coupled between said input stage and said output stage, said planar transformer including an input winding coupled to said input stage and an output winding coupled to said output stage, said input winding having a plurality of input turns and said output winding having a plurality of output turns, wherein said plurality of input turns interleave said plurality of output turns.

2. The power converter in accordance with claim 1, wherein said input stage comprises a plurality of input switches.

3. The power converter in accordance with claim 2, wherein said output stage comprises at least one of a plurality of rectifying diodes and a plurality of output switches.

4. The power converter in accordance with claim 1, wherein said input stage is coupled to said input ceramic layer using direct bond copper (DBC) and said output stage is coupled to said output ceramic layer using DBC.

5. The power converter in accordance with claim 1, wherein said input winding is folded from a flat configuration to a stacked configuration to form said plurality of input turns and said output winding is folded from a flat configuration to a stacked configuration to form said plurality of output turns.

6. The power converter in accordance with claim 1, wherein said planar transformer further comprising a plurality of insulating layers, each insulating layer of said plurality of insulating layers coupled between one input turn of said plurality of input turns and one output turn of said plurality of output turns.

7. The power converter in accordance with claim 6, wherein said plurality of input turns and said plurality of output turns are direct bond copper coupled to said plurality of insulating layers, said plurality of insulating layers comprising a ceramic material.

8. A power system comprising:
   a power input device configured to generate a power input;
   a power output device configured to receive a power output; and
   a power converter comprising:
      an input ceramic layer;
      an output ceramic layer;
      an input stage coupled to said input ceramic layer and said power input device, said input stage configured to receive the power input from said power input device;
      an output stage coupled to said output ceramic layer and said power output device, said output stage configured to generate the power output at least partially as a function of the power input and transmit the power output to said power output device; and a planar transformer coupled between said input stage and said output stage, said planar transformer including an input winding coupled to said input stage, and an output winding coupled to said output stage, said input winding having a plurality of input turns and said output winding having a plurality of output turns, wherein said plurality of input turns interleave said plurality of output turns.

9. The power system in accordance with claim 8, wherein said input stage comprises a plurality of input switches.

10. The power system in accordance with claim 9, wherein the output stage comprises at least one of a plurality of rectifying diodes and a plurality of output switches.

11. The power system in accordance with claim 8, wherein said input stage is coupled to the input ceramic layer using direct bond copper (DBC) and said output stage is coupled to the output ceramic layer using DBC.

12. The power system in accordance with claim 8, wherein said input winding is folded from a flat configuration to a stacked configuration to form said plurality of input turns and said output winding is folded from a flat configuration to a stacked configuration to form said plurality of output turns.

13. The power system in accordance with claim 8, wherein said planar transformer further comprises a plurality of insulating layers, each insulating layer of said plurality of insulating layers coupled between one input turn of said plurality of input turns and one output turn of said plurality of output turns.

14. The power system in accordance with claim 13, wherein said plurality of input turns and said plurality of output turns are coupled to said plurality of insulating layers using direct bond copper, said plurality of insulating layers comprising a ceramic material.

15. A method for assembling a power converter for a power system, said method comprising:
coupling an input stage to an input ceramic layer, the input stage configured to receive a power input;
coupling an output stage to an output ceramic layer, the output stage configured to generate a power output at least partially as a function of the power input; and
coupling a planar transformer between the input stage and the output stage, the planar transformer including an input winding coupled to the input stage and an output winding coupled to the output stage, the input winding having a plurality of input turns and the output winding having a plurality of output turns, wherein the plurality of input turns interleave the plurality of output turns.

16. The method in accordance with claim 15, wherein coupling the input stage to the input ceramic layer comprises coupling a plurality of input switches to the input ceramic layer and coupling the output stage to the output ceramic layer comprising coupling at least one of a plurality of rectifying diodes and a plurality of output switches to the output ceramic layer.

17. The method in accordance with claim 15, wherein coupling the input stage further comprises coupling the input stage to the input ceramic layer using direct bond copper (DBC) and coupling the output stage further comprises coupling the output stage to the output ceramic layer using DBC.

18. The method in accordance with claim 15, wherein coupling the planar transformer comprises:
folding the input winding from a flat configuration to a stacked configuration to form the plurality of input turns; and
folding the output winding from a flat configuration to a stacked configuration to form the plurality of output turns.

19. The method in accordance with claim 15, wherein coupling the planar transformer comprises disposing a plurality of insulating layers between the plurality of input turns and the plurality of output turns, each insulating layer of the plurality of insulating layers coupled between one input turn of the plurality of input turns and one output turn of the plurality of output turns.

20. The method in accordance with claim 19, wherein coupling the planar transformer further comprises:
coupling the plurality of input turns to the plurality of insulating layers, wherein the plurality of input turns are direct bond copper (DBC); and
coupling the plurality of output turns to the plurality of insulating layers, the plurality of insulating layers including a ceramic material, wherein the plurality of output turns are DBC.

* * * * *